Dec. 22, 1959 T. M. WRIGHT 2,918,028

APPARATUS FOR SOLDERING PRINTED CIRCUITS

Filed Dec. 31, 1954

INVENTOR.
Theodore M. Wright
BY Morris Robkin
ATTORNEY.

United States Patent Office 2,918,028

Patented Dec. 22, 1959

2,918,028

APPARATUS FOR SOLDERING PRINTED CIRCUITS

Theodore M. Wright, Camden, N.J., assignor to Radio Corporation of America, a corporation of Delaware Application December 31, 1954, Serial No. 479,089

2 Claims. (Cl. 113—59)

This invention relates to an improved method of and apparatus for soldering, and more particularly to improved methods of and apparatus for simultaneously soldering all of the connections of an assembly which includes a plurality of electric conductors disposed on a surface of electrically insulating material.

Although various types of printed circuits have been utilized in the past, one common type has comprised a sheet of electrically insulating material, such as a phenolic board, carrying on one surface thereof one or more electric conductors in the form of thin, flat stripes or strips integrally united to the insulating material.

Where it is desired to mount a number of circuit components on the other side of the sheet of insulating material and connect them at many points to the printed conductors on the side previously mentioned, there is a considerable problem in making the connections rapidly and efficiently. In a typical assembly, over one hundred connections may be involved, and to make each one of these connections individually with a soldering iron is a tedious process. Consequently, it is desirable to be able to use a process which will enable an operator to solder all of the connections in the same operation or operations. One method of soldering all such connections simultaneously is a dip-soldering technique. In this type of process, the entire side of the assembly containing the printed conductors, with the leads from the circuit components projecting through the various points, can be dipped face down in a bath of molten solder and removed after a brief period of immersion. This results in coating the conductors with solder and soldering all the connection at the same time. However, it has been found that, when the conductors are closely spaced, some of the solder frequently bridges across the closely spaced conductors in places where it is not wanted and therefore causes "shorts." This invention relates to an improved process of soldering an assembly, such as above described, in such a manner as to eliminate some of the disadvantages of the dip soldering method.

One object of the present invention is to provide an improved soldering technique applicable to sheets having exposed metal on one surface thereof.

Another object of this invention is to provide an improved process of soldering printed circuits where the conductors are integrally united to a surface of an insulating material.

A further object of this invention is to provide an improved process of soldering, simultaneously, a large number of conventional circuit components to a printed circuit.

A still further object of this invention is to provide an improved apparatus to accomplish soldering of printed circuits where the conductors are integrally united to a surface of an insulating material.

A still further object of the invention is to provide an improved apparatus to accomplish soldering, simultaneously, a large number of conventional circuit components to a printed circuit.

Still further objects of the present invention are to provide an improved process and apparatus which are readily adaptable to automatic manufacturing techniques.

An apparatus in accordance with the present invention for accomplishing these and other objects includes a container for molten solder. A freely rotatable roller is supported within this container in a position to be almost completely submerged in the solder. The roller is provided with a resilient surface layer to which molten solder will adhere. Guide means are provided for directing a printed circuit assembly across the exposed surface of the roller.

In general, the process of the present invention comprises bringing the underface of a printed circuit assembly to be soldered into engagement with the surface of the above described roller, and passing the assembly over the roller thereby causing the roller to rotate and to deposit solder on metallic portions of the underface. As a result of these steps each of the electric conductors is evenly coated with solder.

The novel features of the invention, as well as additional objects and advantages thereof will be understood more fully from the following description when read in connection with the accompanying drawing, in which.

Figures 1, 2:
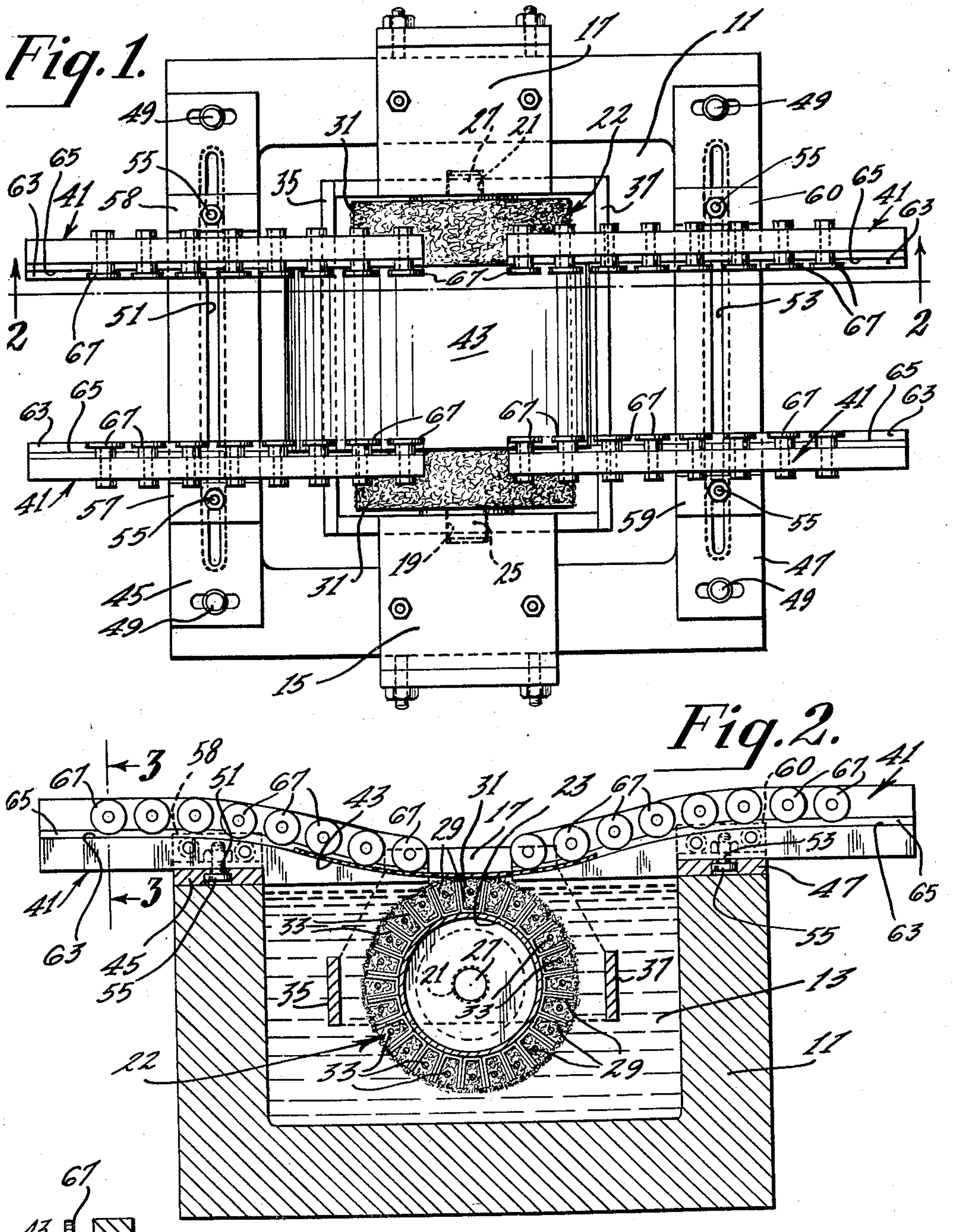
Figure 1 is a top view of an apparatus in accordance with the present invention.
Figure 2 is a sectional elevational view taken along the line 2—2 of Figure 1 looking in the direction of the appended arrows.

Referring in more detail to the accompanying drawing, an apparatus in accordance with the present invention includes a rectangular tank 11 which contains molten solder 13 and which may be provided with a heating element (not shown) for melting the solder and for maintaining the solder in a molten state. The tank 11 is composed of relatively thick vertically extending walls and a flat surface is provided at the upper edge of the tank walls. A pair of L-shaped brackets 15 and 17 are mounted on opposite sides of the tank 11 on the upper surface of the tank walls. These brackets extend toward the interior of the tank 11 and then downwardly into the tank. The downwardly extending portions of the brackets 15 and 17 are each provided with a bearing aperture 19 and 21. These apertures are axially aligned.

A roller 22 comprising a closed cylinder 23 is supported in the bearings 19 and 21 by means of journals 25 and 27 which extend outwardly from the ends of the cylinder. A plurality of trough-like members 29 are attached to the cylinder 23 adjacent each other and are aligned in a longitudinal direction relative to the cylinder. A surface mat for the roller comprises a metallic sponge 31 which consists, for example, of fine woven wire of such density that the surface tension of the solder will maintain the solder at the outer surface of the mat. The troughs 29 are provided so that this metallic sponge 31 may be maintained evenly distributed around the surface of the cylinder. A plurality of rods or wires 33 pass through the troughs 29 and are attached at the ends of the roller to hold the metallic sponge to the cylinder surface. The troughs 29 serve the further purpose of providing buckets around the surface of the roller 22 which carry the solder over the top of the roller and aid in maintaining an ample supply of solder at the roller surface when it engages the surface to be soldered. A pair of connecting members 35 and 37 extend between the downwardly extending portions of the brackets 15 and 17 to provide a rigid structure for supporting the roller. When the solder tank is filled to operating level, only a small portion of the roller surface will extend above the surface of the cylinder.

In order to bring a printed circuit assembly into engagement with the above-described roller 22 a track 41 is provided which engages opposite edges of a printed circuit board 43. The track is discontinuous at a point adjacent the exposed roller surface so that only the printed circuit board 43 will engage the surface of the roller. A pair of mounting bars 45 and 47 are attached to the upper surfaces of opposite walls of the tank 11 by means of bolts 49. The bars 45 and 47 are provided with longitudinal slots 51 and 53, respectively, having an undercut portion which is dimensioned slidably to accommodate the heads of bolts 55. L-shaped brackets 57, 58, 59 and 60, which are secured to the portions of the track 41, and are placed over the bolts 55 and the track is thereby secured to the mounting bars 45 and 47. The track 41 may be adjusted to accommodate printed circuit boards of varying widths by sliding the track laterally along the slots 51 and 53.

Figure 3:
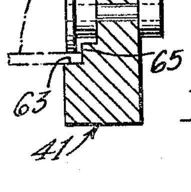
Figure 3 is a sectional view of the guide track taken along the line 3—3 of Figure 2 looking in the direction of the appended arrows.

A cross section of one of the track portions is illustrated in Figure 3. This track portion comprises a ledge 63 upon which a circuit board 43 is supported. A shoulder 65 engages the edge of the circuit board which is guided by a plurality of rollers 67 spaced along the track and mounted to be freely rotatable. These rollers are positioned to maintain the circuit board 43 against the ledge 63.

Referring to Figure 2 it will be noted that the track is provided with a curvature at the portions adjacent the roller. This curvature is provided in order that the circuit board 43 will be curved about an axis which is parallel to the axis of the roller 22. Because of this arrangement it will be impossible for the board to be curved, due to warpage for example, about an axis which is not parallel to the axis of the roller hence insuring that the roller surface will not miss certain portions of the board surface.

In carrying out the soldering operation, the lower side of the circuit board assembly is first brought into contact with a flux such as a solution of alcoholic rosin. This rosin provides a chemical cleaning action which causes the solder to more readily adhere to the metallic portions of the assembly. The assembly is then removed from the flux and is promptly positioned in the track 41 with the printed circuit side down. The board is then urged along the track until one end engages the surface of the roller 22. The rollers 67 at the entry side of the tank near the exposed periphery of the roller 22 are, as above indicated, disposed so that the board is curved and contact with the roller 22 tends to maintain curvature. This insures uniform application of solder at desired solder points. Upon continued movement of the board along the track, the board will move over the roller causing the roller to rotate with the board. The portion of the track on the opposite side of the roller is so disposed that the board will engage this track portion and the above described curvature will be maintained for a short travel distance of the board. As the board is passed over the roller surface an even coating of solder is applied to the metallic strip portions of the printed circuit and all of the component terminals are soldered to the strips. The solder bath may be of any conventional composition such as 60 percent tin and 40 percent lead. This solder bath will be maintained at a temperature appropriate to the particular solder being used. Such temperature will conventionally be about 400° F. to 600° F.

When this method is employed in soldering a printed circuit assembly, it will be found that there is no excess solder adhering to the various parts of the surface and tending to drip when the assembly is removed from the solder. It will further be found that the printed circuit strips may be placed close together on the insulating surface and that there will be no bridging of the solder between these strips when the present method is employed.

What is claimed is:

1. Apparatus for applying solder to a board member having a substantially flat metallic surface, said apparatus comprising a container for molten solder, a roller mounted for free rotation in said container, a portion of the surface of said roller extending above the solder level in said container, a resilient solder-retaining surface layer on said roller, said surface layer comprising fine woven wire of a density such that the surface tension of the solder will cause the solder to remain on the surface of said roller, means for guiding said board member across said roller whereby said metallic surface is caused to contact said roller surface, said roller being rotated in response to the pressure of said member on said roller, and means for providing a convex curvature of said flat metallic surface of said board member in a region adjacent contact with said roller to assure engagement of said member along the length of said roller.

2. Apparatus for applying solder to a printed circuit board having printed wiring on one surface thereof, said apparatus comprising a container for molten solder, a roller horizontally mounted for free rotation in said container, a portion of the surface of said roller extending above the solder level in said container, said roller being provided with a resilient surface layer comprising fine woven wire of a density such that the molten solder will adhere to its surface through the surface tension of the solder, a track for guiding said circuit board across the exposed portion of said roller whereby said printed wiring is engaged by said roller surface, said roller being rotated in response to the pressure of said circuit board on said roller, said track being provided with a curved portion adjacent said roller, and the axis of curvature of said curved portion being above and parallel to the axis of rotation of said roller whereby said one surface of said board will be convexly curved with respect to said roller when in contact therewith.

References Cited in the file of this patent

UNITED STATES PATENTS

| | | |
|---|---|---|
| 732,003 | Leiger | June 23, 1903 |
| 906,603 | Baker | Dec. 15, 1908 |
| 944,607 | Goldsmith | Dec. 28, 1909 |
| 1,052,737 | McColl | Feb. 11, 1913 |
| 1,200,272 | Taylor | Oct. 3, 1916 |
| 1,365,291 | Stevens et al. | Jan. 11, 1921 |
| 1,476,405 | Kronquest | Dec. 4, 1923 |
| 1,660,576 | Owston | Feb. 28, 1928 |
| 1,785,762 | Bundy | Dec. 23, 1930 |
| 2,007,882 | Shields | July 9, 1935 |
| 2,102,679 | Carlson | Dec. 21, 1937 |
| 2,181,319 | Flugge | Nov. 28, 1939 |
| 2,249,182 | Sidebotham et al. | July 15, 1941 |
| 2,326,814 | Wobbe | Aug. 17, 1943 |
| 2,357,349 | Morton | Sept. 5, 1944 |
| 2,396,946 | Grupe | Mar. 19, 1946 |
| 2,473,879 | Guarnaschelli | June 21, 1949 |
| 2,539,988 | Calles et al. | Jan. 30, 1951 |
| 2,577,187 | Fox | Dec. 4, 1951 |
| 2,622,313 | MacDonald | Dec. 23, 1952 |
| 2,671,264 | Pessel | Mar. 9, 1954 |
| 2,754,784 | Maysmor et al. | July 17, 1956 |
| 2,770,875 | Zimmerman | Nov. 20, 1956 |